US010193096B2

(12) United States Patent
Gao et al.

(10) Patent No.: US 10,193,096 B2
(45) Date of Patent: Jan. 29, 2019

(54) ORGANIC LIGHT-EMITTING DIODE ARRAY SUBSTRATE AND DISPLAY APPARATUS

(71) Applicant: BOE Technology Group Co., Ltd., Beijing (CN)

(72) Inventors: Xinwei Gao, Beijing (CN); Na Li, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 84 days.

(21) Appl. No.: 14/771,220

(22) PCT Filed: Nov. 28, 2014

(86) PCT No.: PCT/CN2014/092528
§ 371 (c)(1),
(2) Date: Aug. 28, 2015

(87) PCT Pub. No.: WO2016/015422
PCT Pub. Date: Feb. 4, 2016

(65) Prior Publication Data
US 2016/0365527 A1  Dec. 15, 2016

(30) Foreign Application Priority Data

Jul. 30, 2014  (CN) .......................... 2014 1 0370101

(51) Int. Cl.
H01L 29/08 (2006.01)
H01L 51/50 (2006.01)
(Continued)

(52) U.S. Cl.
CPC ........ H01L 51/5016 (2013.01); C09K 11/025 (2013.01); H01L 51/5004 (2013.01);
(Continued)

(58) Field of Classification Search
CPC .................................................. H01L 51/5016
USPC ........................................................ 257/40
See application file for complete search history.

(56) References Cited

U.S. PATENT DOCUMENTS 6,210,814 B1 * 4/2001 Thompson ............. C09K 11/06
257/94
2005/0121666 A1 6/2005 Kondakova et al.
(Continued)

FOREIGN PATENT DOCUMENTS

CN    101128559 A    2/2008
CN    101911335 A    12/2010
(Continued)

OTHER PUBLICATIONS

Jun. 29, 2016—(CN)—First Office Action Appn 201410370101.9 with English Tran.
(Continued)

Primary Examiner — Ajay Arora
(74) Attorney, Agent, or Firm — Banner & Witcoff, Ltd.

(57) ABSTRACT

An organic light-emitting diode (OLED) array substrate and a display apparatus are disclosed. The OLED array substrate includes a plurality of OLEDs. The OLED includes an anode, a light-emitting layer and a cathode which are provided in this order, and further includes an exciton barrier layer which is arranged between the anode and the light-emitting layer and is in contact with the light-emitting layer. A forming material of the light-emitting layer includes a host material and a guest material which is doped in the host material, and the light-emitting layers of the OLEDs are configured for emitting light of a plurality of colors. A forming material of the exciton barrier layer includes a host material of one light-emitting layer that has a maximum highest occupied molecular orbital energy level amongst the host materials of all light-emitting layers.

13 Claims, 1 Drawing Sheet

(51) Int. Cl.
  *C09K 11/02*  (2006.01)
  *H01L 51/52*  (2006.01)
  *H01L 51/00*  (2006.01)
  *H01L 27/32*  (2006.01)

(52) U.S. Cl.
  CPC ...... *H01L 51/5036* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 51/5281* (2013.01); *H01L 27/3211* (2013.01); *H01L 51/0072* (2013.01); *H01L 51/5012* (2013.01); *H01L 51/5265* (2013.01); *H01L 2251/5376* (2013.01); *H01L 2251/552* (2013.01); *H01L 2251/558* (2013.01)

(56)        References Cited

U.S. PATENT DOCUMENTS

2009/0121624 A1*  5/2009  D'Andrade ......... H01L 51/0025
                                                    313/504
2011/0260145 A1* 10/2011  Omary ................. C07D 401/04
                                                    257/40
2013/0069044 A1   3/2013  Ma
2013/0194477 A1*  8/2013  Ito .................... G03G 15/04054
                                                    257/40
2014/0008639 A1*  1/2014  Thompson .......... C07D 209/86
                                                    257/40

FOREIGN PATENT DOCUMENTS

CN      102214798 A   10/2011
CN      103227188 A    7/2013
CN      104167428 A   11/2014
JP     2013157278 A    8/2013

OTHER PUBLICATIONS

Apr. 27, 2015—International Search Report and Written Opinion Appn PCT/CN2014/092528 with English Tran.

\* cited by examiner

ORGANIC LIGHT-EMITTING DIODE ARRAY SUBSTRATE AND DISPLAY APPARATUS

The application is a U.S. National Phase Entry of International Application No. PCT/CN2014/092528 filed on Nov. 28, 2014, designating the United States of America and claiming priority to Chinese Patent Application No. 201410370101.8 filed on Jul. 30, 2014. The present application claims priority to and the benefit of the above-identified applications and the above-identified applications are incorporated by reference herein in their entirety.

TECHNICAL FIELD

At least one embodiment of the present invention relates to an organic light-emitting diode array substrate and a display apparatus.

BACKGROUND

Organic light-emitting diode display apparatus have advantages of self-luminous property, wide view angle, high contrast, rapid response speed, etc., and are regarded as a new generation of display techniques. Organic light-emitting diode (OLED) array substrate is a primary component of the organic light-emitting diode display apparatus, and includes a plurality of sub-pixels each of which is provided with an organic light-emitting diode capable of emitting a light of a specific color.

SUMMARY

At least one embodiment of the present invention provides an organic light-emitting diode array substrate and a display apparatus in order to simplify the device for preparing the organic light-emitting diode array substrate and to increase the light emitting efficiency.

At least one embodiment of the present invention provides an organic light-emitting diode array substrate which comprises a plurality of organic light-emitting diodes. Each of the organic light-emitting diodes comprises an anode, a light-emitting layer and a cathode which are provided in this order, and further comprises an exciton barrier layer which is provided between the anode and the light-emitting layer and in contact with the light-emitting layer. A forming material of the light-emitting layer comprises a host material and a guest material which is doped in the host material, and light-emitting layers of the OLEDs are configured for emitting light of a plurality of colors. The forming material of the exciton barrier layer comprises a host material of one light-emitting layer that has a maximum highest occupied molecular orbital (HOMO) energy level amongst the host materials of all light-emitting layers.

At least one embodiment of the present invention further provides a display apparatus which comprises the above-mentioned organic light-emitting diode array substrate.

BRIEF DESCRIPTION OF THE DRAWINGS

In order to illustrate the technical solutions of the embodiments of the present invention more clearly, the figures of the embodiments are briefly described below. Apparently, the figures described below merely relate to some embodiments of the present invention rather than are limitative of the present invention.

REFERENCE SIGNS ON THE FIGURES

1: anode; 2: hole injection layer; 3: hole transport layer; 4: light-emitting layer; 5: electron transport layer; 6: electron injection layer; 7: cathode; 8: exciton barrier layer; 9: base substrate.

DETAILED DESCRIPTION

To make the object, technical solutions, and advantages of the embodiments of the present invention clearer, the technical solutions of the embodiments of the present invention will be described below in a clearer and more complete way with reference to the figure of the embodiments of the present invention. Apparently, the embodiments described are only part, rather than all of the embodiments of the present invention. Based on the embodiments of the present invention described, all the other embodiments obtained by a person of ordinary skills in the art without paying inventive work fall into the scope of protection of the present invention.

Figure 1:
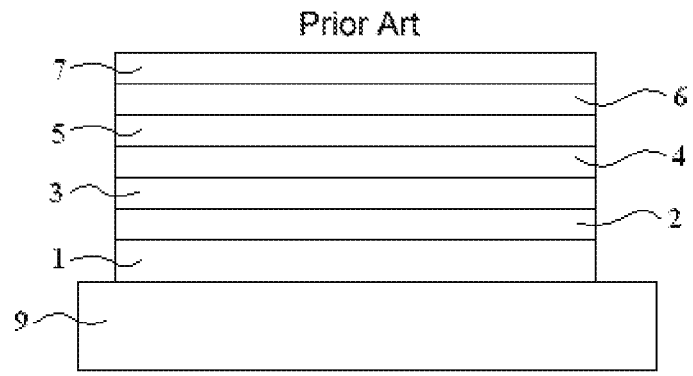
FIG. 1 is a schematic diagram of a sectional structure of an organic light-emitting diode of an OLED array substrate.

The structure of an organic light-emitting diode is as shown in FIG. 1, which may comprise an anode 1, a hole injection layer (HIL) 2, a hole transport layer (HTL) 3, a light-emitting layer (EML) 4, an electron transport layer (ETL) 5, an electron injection layer (EIL) 6 and a cathode 7, which are provided in this order on a base substrate 9 (which is typically made of glass).

The light-emitting layer is the core of the organic light-emitting diode, and the forming material thereof comprises a host material and a guest material which is doped in the host material. The highest occupied molecular orbital (HOMO) energy level of the host material is higher than the HOMO energy level of the guest material, and the lowest unoccupied molecular orbital (LUMO) energy level thereof is lower than the LUMO energy level of the guest material. Accordingly, when electrons and holes are transported to the light-emitting layer, excitons (excited molecules) will be generated in the guest material. When the excitons falls back to the ground state, energy is delivered in the form of light, that is, a light is emitted. The color of the light emitted can be controlled by selecting the host material and the guest material.

The exciton in the light-emitting layer has two excited state, singlet state and triplet state. A singlet state exciton spends a relative short time falling back to the ground state from the excited state, thus the energy thereof is delivered in the form of light energy and light emitting is realized. However, the course of a triplet state exciton falling from the excited state back to the ground state is restrictive and has a long relaxation time, thus the energy thereof may be delivered in the form of none-light energy, such as delivered in the form of thermal energy, vibrational energy, etc., resulting in a reduced light emitting efficiency. Especially for a fluorescence light-emitting layer, unlike a phosphorescence light-emitting layer which has spin orbit coupling effect, the triplet state excitons thereof cannot emit light, resulting in the theoretical light emitting efficiency being only 25% (the generation ratio of singlet state excitons and triplet state excitons is 1:3).

As is discovered by research, triplet state excitons can be quenched by each other, and in this moment the energy thereof can be delivered in the form of light energy, thus the light emitting efficiency of the triplet state excitons can be increased. In order to realize the quenching of triplet state excitons, a "exciton barrier layer" which is contacted with the light-emitting layer is required to be arranged in the organic light-emitting diode, and the HOMO energy level and the triplet state energy level of this layer can not be lower than the HOMO energy level and the triplet state energy level of the host material of the light-emitting layer. In this way, the triplet state excitons can be restricted in the light-emitting layer such that the probability of the quenching among triplet state excitons can be increased and thus the light emitting efficiency can be increased.

In an organic light-emitting diode array substrate, many layers are formed by vapor deposition process. However, the layers of different materials need to be prepared in different vapor deposition devices, such as vapor deposition chambers, respectively. Therefore, if an exciton barrier layer is needed to be added, a corresponding vapor deposition device is needed to be added, which results in a complicated preparation device and a high cost. However, if the exciton barrier layer is not arranged, the light emitting efficiency of the organic light-emitting diode would be relatively low.

Embodiment 1

This embodiment provides an organic light-emitting diode array substrate comprising a plurality of organic light-emitting diodes. The organic light-emitting diode comprises an anode, a light-emitting layer and a cathode which are provided in this order. The light-emitting layers are configured for emitting light of a plurality of colors, and the forming material thereof comprises a host material and a guest material which is doped in the host material. The organic light-emitting diode further comprises an exciton barrier layer which is arranged between the anode and the light-emitting layer and is in contact with the light-emitting layer. The forming material of the exciton barrier layer comprises the host material of one light-emitting layer that has the maximum highest occupied molecular orbital energy level amongst the host materials of all light-emitting layers. In this way, the exciton barrier layer is ensured to be capable of blocking excitons.

In order that the exciton barrier layer can block excitons in a better way, in at least one example, the host material of the above-mentioned one light-emitting layer further has the maximum triplet energy level amongst the host materials of all light-emitting layers.

Because the exciton barrier layer exists in the organic light-emitting diode array substrate of this embodiment, the probability of the quenching among triplet state excitons can be increased and thus the light emitting efficiency can be increased. Meanwhile, the material of the exciton barrier layer further comprises a subject matter of one light-emitting layer, such as the subject matter of a blue light-emitting layer, thus the exciton barrier layer can be prepared by using the vapor deposition device for the light-emitting layer. Therefore the light emitting efficiency can be increased without adding additional preparation device and cost. Furthermore, as for top-emitting organic light-emitting diode array substrate, in the method for preparing the exciton barrier layer by adding an vapor deposition device, a fine metal mask plate is needed during the preparation of the hole transport layer, to adjust the thickness of the resonant cavity and thereby control the wavelength of the light emitted, which results in a complicated device and high cost. However, the exciton barrier layer of the organic light-emitting diode array substrate of this embodiment is prepared in the device for preparing the light-emitting layer which has been provided with a fine metal mask plate therein. Therefore the wavelength of the light emitted can be controlled directly by adjusting the thickness of the exciton barrier layer, thereby simplifying the preparation device and reducing cost.

In at least one example, the thickness of the exciton barrier layer may be 1 to 200 nanometers.

As is discovered by research, the exciton barrier layer having a thickness in the above range can have an increased light emitting efficiency without adversely affecting other performances of the organic light-emitting diode.

In at least one example, the organic light-emitting diode array substrate is a top-emitting organic light-emitting diode array substrate. The exciton barrier layers which are contacted with different color light-emitting layers (i.e. the exciton barrier layers which are contacted with light-emitting layers configured for emitting light of different colors) have different thickness. That is, for the top-emitting organic light-emitting diode array substrate, the exciton barrier layers in different color organic light-emitting diodes (i.e. the exciton barrier layers in organic light-emitting diodes configured for emitting light of different colors) have different thickness.

In the top-emitting organic light-emitting diode array substrate, the light emitted by the light-emitting layer is emitted after repeated oscillation in the resonant cavity between the reflection layers of the cathode and the anode, and the wavelength of the light emitted is relevant to the thickness of the resonant cavity. Therefore, the resonant cavities in different color organic light-emitting diodes have different thickness to match the wavelength range of the light emitted with the color better. In the preparation method of the case as shown in FIG. 1, the thickness of the resonant cavity is adjusted mainly by adjusting the thickness of the hole transport layer of different color organic light-emitting diodes. If the thickness of the hole transport layers is required to be different, a fine metal mask plate (FFM) is needed to be used during the vapor deposition thereof, to form hole transport layers of the different color organic light-emitting diodes respectively. However, the hole transport layers of all organic light-emitting diodes could have been formed simultaneously by vapor deposition at one time, thus the conventional vapor deposition device for hole transport layers is not provided with any fine metal mask plate. Therefore, in order to prepare hole transport layers of different thickness, a fine metal mask plate is needed to be added, which results in complicated structure and increased cost of the preparation device.

However, in this embodiment, the thickness of the resonant cavity is adjusted by adjusting the thickness of the exciton barrier layer, and the forming materials of the exciton barrier layer comprise the host material of a light-emitting layer, thus the exciton barrier layer can be prepared in the vapor deposition device for preparing the light-emitting layer. The organic light-emitting diodes configured for emitting light of different colors have different light-emitting layer materials, thus the vapor deposition device for preparing light-emitting layers is provided with a fine metal mask plate in itself to ensure forming the light-emitting layers just in required zones. In this way, the adjustment of the thickness of the resonant cavity can be achieved directly by using the device for preparing light-emitting layers without adding a fine metal mask plate in the device, which results in simple structure and low cost of the preparation device.

In at least one example, the light-emitting layers comprise a red light-emitting layer, a green light-emitting layer and a blue light-emitting layer, and the forming materials of the exciton barrier layer comprise the host material of the blue light-emitting layer.

Red-Green-Blue tri-color mode (RGB mode) is a most commonly-used display mode. In the light-emitting layers of these three colors, the host material of the blue light-emitting layer has typically a HOMO energy level and triplet state energy level greater than or equal to that of the host materials of the other two light-emitting layers. Thus the host material of the blue light-emitting layer may be used to prepare the exciton barrier layer.

In at least one example, the host material of the green light-emitting layer is the same as that of the blue light-emitting layer. That is, the green light-emitting layer may use the same host material as the blue light-emitting layer; and the guest materials are different, of course. Thus the preparation device and process may be further simplified. Theoretically, the red light-emitting layer may use the same host material as the blue light-emitting layer, but it is relatively difficult.

In at least one example, the host material of the blue light-emitting layer may be any one of 3-tertiary butyl-9, 10-bis(2-naphthalene)anthracene (MADN), 4,4'-di(2,2-distyryl)-1,1'-biphenyl (DPVBi), 4,4'-bis(9-carbazole)biphenyl (CBP), 4,4',4''-tri(carbazol-9-yl)triphenylamine (TCTA) and 1,3-N,N-biscarbazole-benzene (mCP).

As is discovered by research, the above materials are relatively suitable as the host material of the blue light-emitting layer of the embodiments of the present invention in terms of electrical conductivity, energy level, hole and electron transport performances, and etc.

In at least one example, the blue light-emitting layer is a fluorescence light-emitting layer; and/or the red light-emitting layer and the green light-emitting layer are phosphorescence light-emitting layers.

As stated above, a phosphorescence light-emitting layer has a higher light emitting efficiency than a fluorescence light-emitting layer, thus the red light-emitting layer and the green light-emitting layer are preferably phosphorescence light-emitting layers. However, a blue phosphorescence light-emitting layer is problematic in terms of lifetime, color purity and etc., and the practical application is relatively difficult, thus the blue light-emitting layer is preferably a fluorescence light-emitting layer.

In at least one example, the organic light-emitting diode may further comprise: a hole transport layer arranged between the anode and the exciton barrier layer; and an electron transport layer arranged between the cathode and the light-emitting layer. On the basis of this, such as, the organic light-emitting diode may further comprise: a hole injection layer arranged between the hole transport layer and the anode; and an electron injection layer arranged between the electron transport layer and the cathode.

The above layers can improve the transport of electrons and holes, thereby increasing the performance of the organic light-emitting diode.

Embodiment 2

Figure 2:
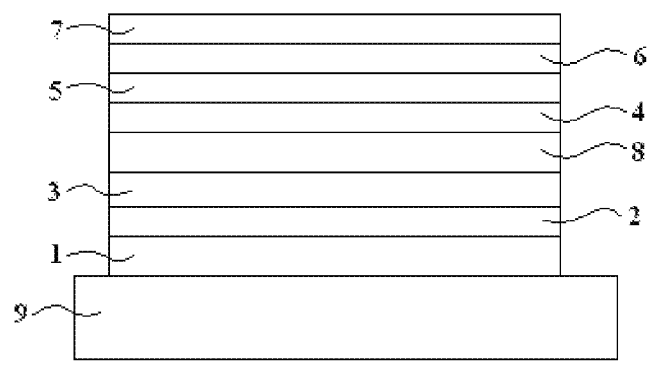
FIG. 2 is a schematic diagram of a sectional structure of an organic light-emitting diode of the OLED array substrate of Embodiment 2 of the present invention.
Figure 3:
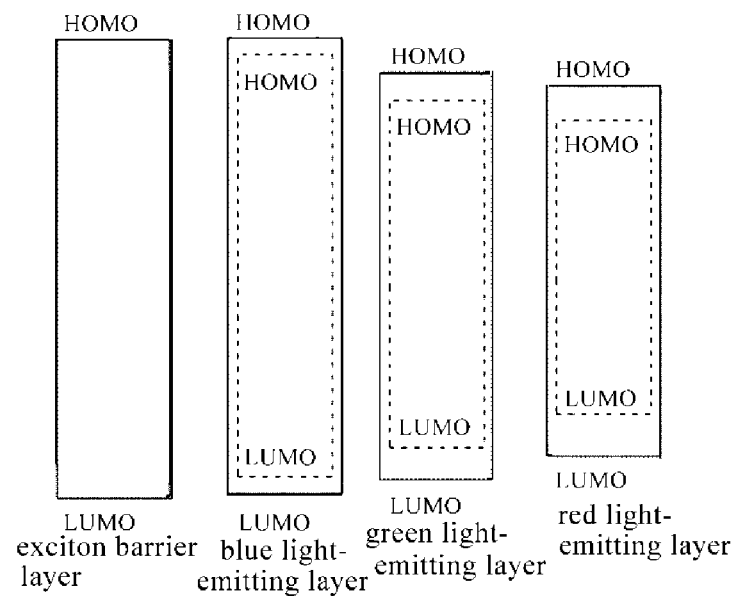
FIG. 3 is a schematic comparison diagram of energy levels of some layers of an organic light-emitting diode of the OLED array substrate of Embodiment 2 of the present invention.

As shown in FIG. 2 and FIG. 3, this embodiment provides an organic light-emitting diode array substrate.

The organic light-emitting diode array substrate comprises a plurality of sub-pixels. An organic light-emitting diode is arranged in each sub-pixel. Meanwhile, the sub-pixels are classified into three colors: red, green and blue, that is, the organic light-emitting diodes in the sub-pixels are classified into three colors: red, green and blue.

For example, as shown in FIG. 2, the organic light-emitting diodes are arranged on a substrate 9 which is typically made of glass. In the direction way from the substrate 9, the organic light-emitting diode comprises in sequence: an anode 1, a hole injection layer 2, a hole transport layer 3, an exciton barrier layer 8, a light-emitting layer 4, an electron transport layer 5, an electron injection layer 6 and a cathode 7. The structure will be introduced one by one as follows.

(1) Anode 1: made of transparent indium tin oxide (ITO) material, with a thickness of 130 nm.

(2) Hole injection layer 2: made of 4,4',4''-tri(N-3-methylphenyl-N-phenylamino)triphenylamine (m-MTDATA, HOMO energy level of 5.1 eV, LUMO energy level of 2.0 eV), with a thickness of 65 nm.

(3) Hole transport layer 3: made of N,N'-di(1-naphthyl)-N,N'-diphenyl-1,1'-biphenyl-4,4'-diamine (NPB, HOMO energy level of 5.4 ev, LUMO energy level of 2.4 eV), with a thickness of 20 nm.

(4) Exciton barrier layer 8: no matter what color of the organic light-emitting diode is, the material of the exciton barrier layer 8 thereof is the same as the host material of the blue light-emitting layer 4, which may be 1,3-N,N-bicarbozole-benzene (mCP, HOMO energy level of 6.1 eV, LUMO energy level of 2.4 eV, triplet state energy level of 2.9 eV), with a thickness of 10 nm.

FIG. 3 shows the relationship of the HOMO energy levels and LUMO energy levels of the exciton barrier layer 8 and light-emitting layers 4 for all colors in this embodiment. In FIG. 3, a higher position means a higher energy level; solid line frames mean the energy levels of the host materials; dash line frames mean the energy levels of the guest materials. As shown, because of using the same material, the exciton barrier layer 8 and the host material of the blue light-emitting layer 4 has an equivalent HOMO energy level which is higher than the HOMO energy levels of the host materials of the green light-emitting layer 4 and the red light-emitting layer 4, thereby ensuring that the exciton barrier layer 8 is capable of blocking excitons.

(5) Light-emitting layer 4: as for the organic light-emitting diodes of different colors, the light-emitting layer 4 therein has the corresponding color.

The green organic light-emitting diode is provided with a green light-emitting layer 4 therein, which has a host material of, such as, Green Host1 (HOMO energy level of 5.39 eV, LUMO energy level of 1.95 eV, triplet state energy level of 2.38 eV); a guest material of Green Dopant1 (HOMO energy level of 5.14 eV, LUMO energy level of 2.74 eV, triplet state energy level of 2.36 eV, doping mass percent of 3%); and a thickness of 30 nm.

The red organic light-emitting diode is provided with a red light-emitting layer 4 therein, which has a host material of Red Host1 (HOMO energy level of 5.4 eV, LUMO energy level of 2.8 eV, triplet state energy level of 2.2 eV); a guest material of Red Dopant1 (HOMO energy level of 5.1 eV, LUMO energy level of 3.1 eV, triplet state energy level of 2 eV, doping mass percent of 4%); and a thickness of 40 nm.

The blue organic light-emitting diode is provided with a blue light-emitting layer 4 therein, which has a host material of 1,3-N,N-bicarbozole-benzene (mCP, HOMO energy level of 6.1 eV, LUMO energy level of 2.4 eV, triplet state energy level of 2.9 eV); a guest material of Blue Dopant1 (HOMO energy level of 5.5 eV, LUMO energy level of 2.7 eV, triplet state energy level of 2.7 eV, doping mass percent of 2%); and a thickness of 20 nm.

In the above example, Green Host1, Green Dopant1, Red Host1, Red Dopant1, Blue Dopant1 and other materials are trade names for commercially available host materials and guest materials of light-emitting layers, thus the detailed compositions thereof are not further limited herein. As can be understood, a person skilled in the art may also select other known materials or products for the host materials and guest materials of these light-emitting layers.

(6) Electron transport layer 5: the material thereof is bis(2-methyl-8-hydroxy quinoline)(4-biphenoxyl) aluminium (BAlq, HOMO energy level of 5.9 ev, LUMO energy level of 2.9 eV), with a thickness of 20 nm.

(7) Electron injection layer 6: the material thereof is lithium fluoride (LiF), with a thickness of 1.5 nm.

(8) Cathode 7; the material thereof is aluminium, with a thickness of 80 nm.

The cathode 7 is relatively thick, thus has a great reflectance and can reflect back the incident light and emit it out of the substrate 9. Therefore, the organic light-emitting diode of this embodiment is of bottom-emitting type.

In this embodiment, the anodes 1 of the above-mentioned organic light-emitting diodes are independent from each other, such that the brightness of the light emitted by each organic light-emitting diode can be adjusted independently. The light-emitting layers 4 configured for emitting light of different colors have different materials, thus they are also independent from each other. Contrarily, in order to be prepared easily, the other layers of the different organic light-emitting diodes can be connected integrally.

Under the maximum gray scale, the organic light-emitting diodes configured for emitting light of all colors in the organic light-emitting diode array substrate of this embodiment are tested for the light-emitting brightness. As determined, the light-emitting brightness of the green organic light-emitting diode is 28 cd/A; the light-emitting brightness of the red organic light-emitting diode is 14 cd/A; and the light-emitting brightness of the blue organic light-emitting diode is 7.6 cd/A.

Correspondingly, under the maximum gray scale, the organic light-emitting diodes configured for emitting light of all colors in a comparative organic light-emitting diode array substrate, which differs from this embodiment only in having no exciton barrier layer 8 therein, are tested for the light-emitting brightness. As determined, the light-emitting brightness of the green organic light-emitting diode is 21 cd/A; the light-emitting brightness of the red organic light-emitting diode is 12 cd/A; and the light-emitting brightness of the blue organic light-emitting diode is 7.2 cd/A.

As seen, after adding the exciton barrier layer 8, the light-emitting brightness of the green organic light-emitting diode, the red organic light-emitting diode and the blue organic light-emitting diode is increased by 33%, 16%, 5%, respectively. That is, the light emitting efficiency of the organic light-emitting diodes configured for emitting light of all colors in the organic light-emitting diode array substrate can be increased greatly by providing the exciton barrier layer 8. Meanwhile, the exciton barrier layer 8 is made of the host material of the blue light-emitting layer 4, therefore the exciton barrier layer 8 can be prepared in the vapor deposition device for preparing the blue light-emitting layer 4. In this way, no new device is needed to add and the cost is low.

Embodiment 3

As shown in FIG. 2, this embodiment provides an organic light-emitting diode array substrate.

The organic light-emitting diode array substrate comprises a plurality of sub-pixels in each of which an organic light-emitting diode is arranged. Meanwhile, the sub-pixels are classified into three colors: red, green and blue, that is, the organic light-emitting diodes in the sub-pixels are classified into three colors: red, green and blue.

For example, as shown in FIG. 2, the organic light-emitting diodes are arranged on a base substrate 9 which is typically made of glass. In the direction away from the substrate 9, the organic light-emitting diode comprises in sequence: an anode 1, a hole injection layer 2, a hole transport layer 3, an exciton barrier layer 8, a light-emitting layer 4, an electron transport layer 5, an electron injection layer 6 and a cathode 7. The structure will be introduced one by one as follows.

(1) Anode 1: made of transparent indium tin oxide (ITO) material, with a thickness of 15 nm; and a metal reflection layer, such as a silver reflection layer, is arranged on the anode close to the substrate 9.

The reflection layer is arranged because the organic light-emitting diode array substrate of this embodiment is of top-emitting type, that is, the light emitted by the light-emitting layer 4 is emitted out of the cathode 7 after reflected.

(2) Hole injection layer 2: made of 4,4',4''-tri(N-3-methylphenyl-N-phenylamino)triphenylamine (m-MTDATA, HOMO energy level of 5.1 eV, LUMO energy level of 2.0 eV), with a thickness of 70 nm.

(3) Hole transport layer 3: made of N,N'-di(1-naphthyl)-N,N'-diphenyl-1,1'-biphenyl-4,4'-diamine (NPB, HOMO energy level of 5.4 ev, LUMO energy level of 2.4 eV), with a thickness of 15 nm.

(4) Exciton barrier layer 8: no matter what color of the organic light-emitting diode is, the material of the exciton barrier layer 8 thereof is the same as the host material of the blue light-emitting layer 4, which is 1,3-N,N-bicarbozolebenzene (mCP, HOMO energy level of 6.1 eV, LUMO energy level of 2.4 eV, triplet state energy level of 2.9 eV).

Because the organic light-emitting diode array substrate of this embodiment is of top-emitting type, the exciton barrier layers 8 of the organic light-emitting diodes configured for emitting light of all colors have different thickness in order to adjust the thickness of the resonant cavity by adjusting the thickness of the exciton barrier layer 8, thereby adjust the wavelength of the light emitted.

For example, the exciton barrier layer 8 of the green organic light-emitting diode has a thickness of 35 nm; the exciton barrier layer 8 of the red organic light-emitting diode has a thickness of 45 nm; and the exciton barrier layer 8 of the blue organic light-emitting diode has a thickness of 15 nm.

(5) Light-emitting layer 4: the light-emitting layer 4 of the organic light-emitting diodes of different colors has the corresponding color.

The green organic light-emitting diode is provided with a green light-emitting layer 4 therein, which has a host material of, such as, Green Host1 (HOMO energy level of 5.39 eV, LUMO energy level of 1.95 eV, triplet state energy level of 2.38 eV); a guest material of Green Dopant1 (HOMO energy level of 5.14 eV, LUMO energy level of 2.74 eV, triplet state energy level of 2.36 eV, doping mass percent of 3%); and a thickness of 30 nm.

The red organic light-emitting diode is provided with a red light-emitting layer 4 therein, which has a host material of Red Host1 (HOMO energy level of 5.4 eV, LUMO energy level of 2.8 eV, triplet state energy level of 2.2 eV); a guest material of Red Dopant1 (HOMO energy level of 5.1 eV, LUMO energy level of 3.1 eV, triplet state energy level of 2 eV, doping mass percent of 4%); and a thickness of 40 nm.

The blue organic light-emitting diode is provided with a blue light-emitting layer 4 therein, which has a host material of 1,3-N,N-bicarbozole-benzene (mCP, HOMO energy level of 6.1 eV, LUMO energy level of 2.4 eV, triplet state energy level of 2.9 eV); a guest material of Blue Dopant1 (HOMO energy level of 5.5 eV, LUMO energy level of 2.7 eV, triplet state energy level of 2.7 eV, doping mass percent of 2%); and a thickness of 20 nm.

(6) Electron transport layer 5: the material thereof is bis(2-methyl-8-hydroxy quinoline)(4-biphenoxyl) aluminium (BAlq, HOMO energy level of 5.9 ev, LUMO energy level of 2.9 eV), with a thickness of 20 nm.

(7) Electron injection layer 6: the material thereof is lithium fluoride (LiF), with a thickness of 1.5 nm.

(8) Cathode 7: the material thereof is magnesium silver alloy, with a thickness of 15 nm.

The cathode 7 is relatively thin, thus is transparent and allows light to emit out through it. Therefore, the organic light-emitting diode of this embodiment is of top-emitting type.

In this embodiment, the anodes 1 of the above-mentioned organic light-emitting diodes are independent from each other, such that the brightness of the light emitted by each organic light-emitting diode can be controlled independently. The light-emitting layers 4 of different colors have different materials, and the exciton barrier layers 8 have different thickness, thus they are also independent from each other. Contrarily, in order to be prepared easily, the other layers of the different organic light-emitting diodes can be connected integrally.

Under the maximum gray scale, the organic light-emitting diodes configured for emitting light of all colors in the organic light-emitting diode array substrate of this embodiment are tested for the light-emitting brightness. As determined, the light-emitting brightness of the green organic light-emitting diode is 47 cd/A; the light-emitting brightness of the red organic light-emitting diode is 27 cd/A; and the light-emitting brightness of the blue organic light-emitting diode is 5.5 cd/A.

Correspondingly, under the maximum gray scale, the organic light-emitting diodes configured for emitting light of all colors in a comparative organic light-emitting diode array substrate, which differs from this embodiment only in having no exciton barrier layer 8 therein, are tested for the light-emitting brightness. As determined, the light-emitting brightness of the green organic light-emitting diode is 40 cd/A; the light-emitting brightness of the red organic light-emitting diode is 22 cd/A; and the light-emitting brightness of the blue organic light-emitting diode is 5 cd/A.

As seen, after adding the exciton barrier layer 8, the light-emitting brightness of the green organic light-emitting diode, the red organic light-emitting diode and the blue organic light-emitting diode is increased by 17%, 22%, 10%, respectively. That is, the light emitting efficiency of the organic light-emitting diodes configured for emitting light of all colors in the organic light-emitting diode array substrate can be increased greatly by providing the exciton barrier layer 8. Meanwhile, the exciton barrier layer 8 is made of the host material of the blue light-emitting layer 4, therefore the exciton barrier layer 8 can be prepared in the vapor deposition device for preparing the blue light-emitting layer 4. In this way, no new device is needed to add and the cost is low. Furthermore, as for the top-emitting organic light-emitting diode array substrate, a fine metal mask plate has been provided in the preparation device for the exciton barrier layer 8, that is, the preparation device for the blue light-emitting layer 4, therefore exciton barrier layers 8 of different thicknesses can be prepared in the organic light-emitting diodes for all colors by using this preparation device, thereby having a function of adjusting the thickness of the resonant cavity and the wavelength of the light emitted, and an additional fine metal mask plate is not needed to added in the preparation device of the hole transport layer 3. Thus the preparation device thereof is simple and the cost is low.

Obviously, the organic light-emitting diode array substrate of each above-mentioned embodiment further comprises many other structures, such as driving circuits for driving each organic light-emitting diode to emit light, grid wires, data wires, etc. These structures can be used in known manner; therefore they are not further described in details herein.

It should be understood that the above embodiments can be modified in many ways.

For example, the above embodiments are illustrated with the light-emitting layers configured for emitting light of three colors: red, green and blue; however, the light-emitting layers can be configured for emitting light of more colors, such as a yellow light-emitting layer. No matter how many colors the light-emitting layers will have, the host material of the light-emitting layer having the highest HOMO energy level is used for the exciton barrier layer. It needs to be explained that the host material of the light-emitting layer having the highest HOMO energy level and the highest triplet energy level also can be used for the exciton barrier layer.

For another example, the hole injection layer, the hole transport level, the electron injection layer, the electron transport layer of the organic light-emitting diode is mainly used for improving the transport of holes and electrons, thus one or more of these layers can be omitted.

For another example, the specific materials, thickness and others of the above-mentioned layers can be changed by a person skilled in the art as needed.

Embodiment 4

This embodiment provides a display apparatus comprising any one of the above organic light-emitting diode array substrates. The display apparatus can be any product or component having display function, such as OLED panel, electronic paper, mobile phone, TV set, display, laptop computer, digital photo frame, navigator, etc.

The above description is merely exemplary embodiments which are not used for limiting the scope of protection of the present invention which is, however, determined by the attached claims.

The present application claims the priority of the Chinese Patent Application No. 201410370101.8 submitted on Jul. 30, 2014, and the content disclosed in the above Chinese patent application is incorporated by reference as part of this application.

What is claimed is:

1. An organic light-emitting diode (OLED) array substrate, comprising a plurality of OLEDs,
wherein each of the OLEDs comprises: an anode, a light-emitting layer configured for emitting light of a color, and a cathode which are provided in this order,
wherein a forming material of the light-emitting layer of each of the OLEDs comprises a host material and a guest material which is doped in the host material, and light-emitting layers of the OLEDs are configured for emitting light of a plurality of colors, wherein each of the OLEDs further comprises an exciton barrier layer which is provided between the anode and the light-emitting layer and in contact with the light-emitting layer, and a forming material of the exciton barrier layer comprises a host material of one light-emitting layer that has a maximum highest occupied molecular orbital energy level amongst the host materials of all of the light-emitting layers of the OLEDs, and wherein the light-emitting layers of the OLEDs comprise a red light-emitting layer, a green light-emitting layer and a blue light-emitting layer; the forming material of the exciton barrier layer comprises a host material of the blue light-emitting layer; and HOMO energy levels of the host materials of the blue light-emitting layer, green light-emitting layer and red light-emitting layer gradually decrease, and LUMO energy levels of the host materials of the blue light-emitting layer, green light-emitting layer and red light-emitting layer gradually increase.

2. The OLED array substrate according to claim 1, wherein
the host material of the one light-emitting layer has a maximum triplet state energy level amongst the host materials of all of the light-emitting layers of the OLEDs.

3. The OLED array substrate according to claim 1, wherein
the exciton barrier layer has a thickness of 1 nm to 200 nm.

4. The OLED array substrate according to claim 1, wherein
the OLED array substrate is a top-emitting OLED array substrate; and
the exciton barrier layers which are in contact with light-emitting layers configured for emitting light of different colors have different thicknesses.

5. The OLED array substrate according to claim 1, wherein
the green light-emitting layer and the blue light-emitting layer have a same host material.

6. The OLED array substrate according to claim 1, wherein
the host material of the blue light-emitting layer comprises any one of 3-tertiary butyl-9,10-bis(2-naphthalene)anthracene, 4,4'-di(2,2-distyryl)-1,1'-biphenyl, 4,4'-bis(9-carbazole)biphenyl, 4,4',4"'-tri(carbazol-9-yl)diphenylamine and 1,3-N,N-biscarbazole-benzene.

7. The OLED array substrate according to claim 1, wherein
the blue light-emitting layer is a fluorescence light-emitting layer; and/or
the red light-emitting layer and the green light-emitting layer are phosphorescence light-emitting layers.

8. The OLED array substrate according to claim 1, wherein the OLED further comprises:
a hole transport layer arranged between the anode and the exciton barrier layer; and an electron transport layer arranged between the cathode and the exciton barrier layer.

9. The OLED array substrate according to claim 8, wherein the OLED further comprises:
a hole injection layer arranged between the hole transport layer and the anode; and
an electron injection layer arranged between the electron transport layer and the cathode.

10. A display apparatus, comprising:
an organic light-emitting diode (OLED) array substrate, comprising a plurality of OLEDs,
wherein each of the OLEDs comprises: an anode, a light-emitting layer configured for emitting light of a color, and a cathode which are provided in this order,
wherein a forming material of the light-emitting layer of each of the OLEDs comprises a host material and a guest material which is doped in the host material, and light-emitting layers of the OLEDs are configured for emitting light of a plurality of colors,
wherein each of the OLEDs further comprises an exciton barrier layer which is provided between the anode and the light-emitting layer and in contact with the light-emitting layer, and a forming material of the exciton barrier layer comprises a host material of one light-emitting layer that has a maximum highest occupied molecular orbital energy level amongst the host materials of all of the light-emitting layers of the OLEDs, and
wherein the light-emitting layers of the OLEDs comprise a red light-emitting layer, a green light-emitting layer and a blue light-emitting layer; the forming material of the exciton barrier layer comprises a host material of the blue light-emitting layer; and HOMO energy levels of the host materials of the blue light-emitting layer, green light-emitting layer and red light-emitting layer gradually decrease, and LUMO energy levels of the host materials of the blue light-emitting layer, green light-emitting layer and red light-emitting layer gradually increase.

11. The display apparatus according to claim 10, wherein the host material of the one light-emitting layer has a maximum triplet state energy level amongst the host materials of all of the light-emitting layers of the OLEDs.

12. The OLED array substrate according to claim 2, wherein
the exciton barrier layer has a thickness of 1 nm to 200 nm.

13. The OLED array substrate according to claim 2, wherein
the OLED array substrate is a top-emitting OLED array substrate; and
the exciton barrier layers which are in contact with light-emitting layers configured for emitting light of different colors have different thicknesses.

* * * * *